(12) United States Patent
Yang et al.

(10) Patent No.: US 10,645,800 B1
(45) Date of Patent: May 5, 2020

(54) HIGH-FREQUENCY CIRCUIT BOARD AND METHOD FOR MANUFACTURING THE SAME

(71) Applicants: Avary Holding (Shenzhen) Co., Limited., Shenzhen (CN); Hong Heng Sheng Electronical Technology (HuaiAn)Co.,Ltd., Huaian (CN)

(72) Inventors: Yong-Quan Yang, Qinhuangdao (CN); Yong-Chao Wei, Qinhuangdao (CN)

(73) Assignees: Avary Holding (Shenzhen) Co., Limited., Shenzhen (CN); Hong Heng Sheng Electronical Technology (HuaiAn)Co., Ltd., Huaian (CN)

( * ) Notice: Subject to any disclaimer, the term of this patent is extended or adjusted under 35 U.S.C. 154(b) by 0 days.

(21) Appl. No.: 16/555,004

(22) Filed: Aug. 29, 2019

(30) Foreign Application Priority Data

May 20, 2019 (CN) .......................... 2019 1 0419408

(51) Int. Cl.
| | |
|---|---|
| *H05K 3/46* | (2006.01) |
| *H05K 1/02* | (2006.01) |
| *H05K 1/14* | (2006.01) |
| *H05K 3/40* | (2006.01) |
| *H05K 1/11* | (2006.01) |

(52) U.S. Cl.
CPC ............. *H05K 1/024* (2013.01); *H05K 1/115* (2013.01); *H05K 1/144* (2013.01); *H05K 3/4038* (2013.01); *H05K 3/4697* (2013.01); *H05K 2201/09509* (2013.01)

(58) Field of Classification Search
CPC ........ H05K 1/024; H05K 1/115; H05K 1/144; H05K 3/4038; H05K 3/4697; H05K 2201/09509
USPC .......................................... 174/250
See application file for complete search history.

(56) References Cited

U.S. PATENT DOCUMENTS

| | | | |
|---|---|---|---|
| 6,388,207 B1* | 5/2002 | Figueroa | H01L 23/49805 174/261 |
| 2018/0098430 A1* | 4/2018 | Sato | H01L 21/4857 |
| 2018/0288879 A1* | 10/2018 | Tuominen | H05K 3/4697 |
| 2019/0200462 A1* | 6/2019 | Furutani | H05K 3/4608 |
| 2019/0261513 A1* | 8/2019 | Hizume | H05K 1/115 |

* cited by examiner

*Primary Examiner* — Tremesha S Willis
(74) *Attorney, Agent, or Firm* — ScienBiziP, P.C.

(57) ABSTRACT

A high-frequency circuit board includes a first circuit structure, a second circuit structure, and a dielectric layer formed on the second circuit structure. The first circuit structure includes a first substrate layer and at least one first circuit layer. The at least one first circuit layer is formed on at least one surface of the first substrate layer. At least one receiving cavity is defined in the first substrate layer. A second circuit structure is embedded in the receiving cavity. The second circuit structure includes a second substrate layer, at least one second circuit layer embedded in the second substrate layer, and a plurality of support columns formed on the second substrate layer. A portion of the dielectric layer is filled into gaps between an inner wall of the receiving cavity and the second circuit structure. The support columns are embedded in the dielectric layer.

15 Claims, 9 Drawing Sheets

HIGH-FREQUENCY CIRCUIT BOARD AND METHOD FOR MANUFACTURING THE SAME

FIELD

The present disclosure relates to a high-frequency circuit board and method for manufacturing the high-frequency circuit board.

BACKGROUND

With the development and application of 4G/5G high-frequency transmission technology and digital wireless processing technology, dielectric constant and dielectric loss of a high-frequency circuit board have higher requirements than a traditional circuit board. In a traditional circuit board manufacturing process, if high-frequency signals are required, the circuit board should be usually made of high-frequency materials, which increases thickness and cost of the circuit board. Moreover, as the circuit density of the circuit board increases, the signal interference between the circuits increases.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION OF EMBODIMENTS

Figure 1:
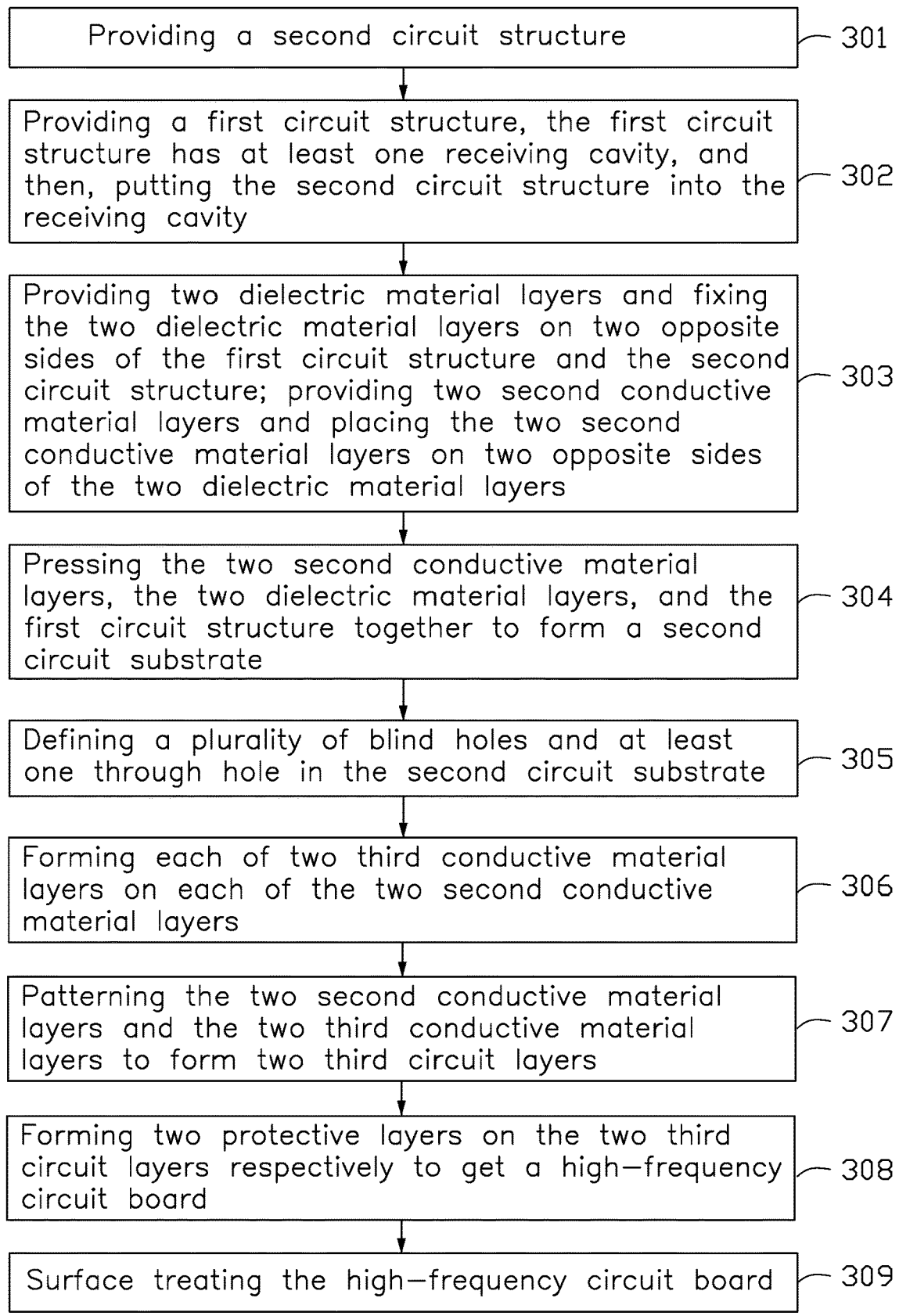
FIG. 1 is a flowchart of a method for manufacturing a high-frequency circuit board in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a flow chart of a method for manufacturing a high-frequency circuit board 10 (20) in accordance with an embodiment of the present disclosure. The example method is provided by way of example, as there are a variety of ways to carry out the method. The method described below can be carried out using the configurations illustrated in FIGS. 2-13, for example, and various elements of these figures are referenced in explaining example method. Each block shown in FIG. 1 represents one or more processes, methods, or subroutines, carried out in the example method. Additionally, the illustrated order of blocks is by example only and the order of the blocks can change. The example method can begin at block 301.

Figure 2:
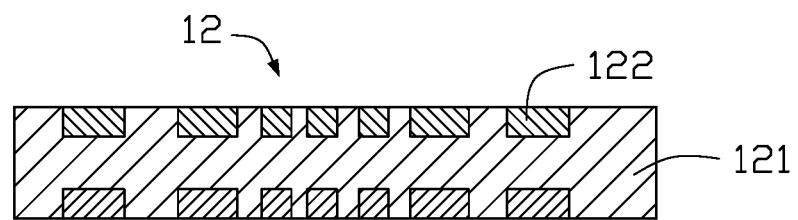
FIG. 2 is a cross-sectional view of a second circuit structure.
Figure 3:
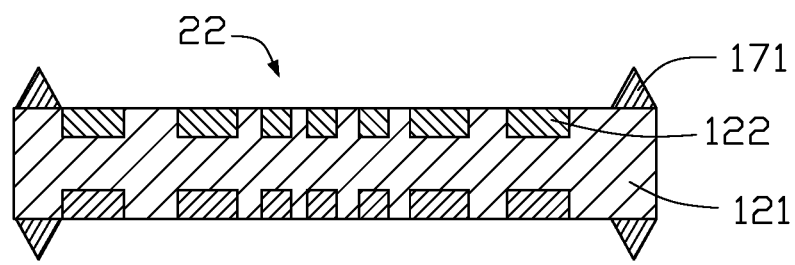
FIG. 3 is a cross-sectional view of another second circuit structure.
Figure 4:
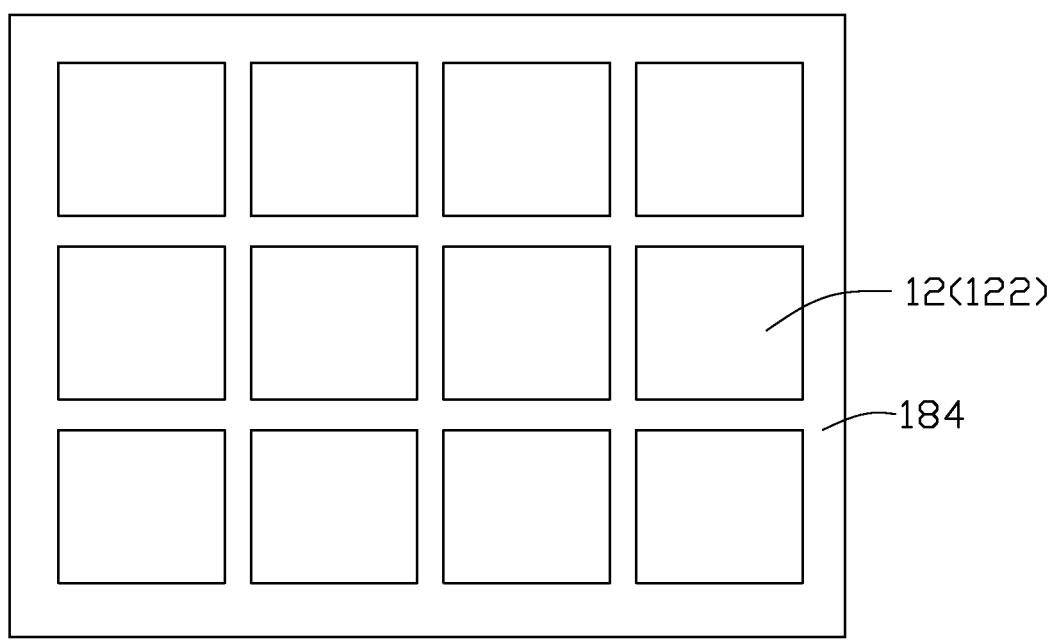
FIG. 4 is a top view showing a plurality of the second circuit structures is made on a base board at the same time.

At block 301, referring to FIG. 2-3, a second circuit structure 12 or 22 is provided.

In at least one embodiment, referring to FIG. 2, the second circuit structure 12 includes a second substrate layer 121 and two second circuit layers 122 imbedded in the second substrate layer 121. The second substrate layer 121 includes a first surface 1211 and a second surface 1212 opposite to the second surface 1212. Each of the two second circuit layer 122 includes a third surface 1221. One of the third surfaces 1221 is flush with the first surface 1211, and the other one of the third surfaces 1221 is flush with the second surface 1212.

The second substrate layer 121 is made from a high frequency material. The high frequency material may be one of Rogers' RO4003, RO3003, RO4350, RO5880, TUC's Tuc862, 872SLK, 883, 933, Panasonic's Megtron4, Megtron6, etc. The Rogers, TUC, and Panasonic are manufacturers. The RO4003, RO3003, RO4350, RO5880, Tuc862, 872SLK, 883, 933, Megtron4, and Megtron6 are product model.

In other embodiment, referring to FIG. 3, the second circuit structure 22 includes a second substrate layer 121, two second circuit layer 122 imbedded in the second substrate layer 121, and a plurality of support columns 171 formed on the second substrate layer 121. The second substrate layer 121 includes a first surface 1211 and a second surface 1212 opposite to the second surface 1212. Each of the two second circuit layers 122 includes a third surface 1221. One of the third surfaces 1221 is flush with the first surface 1211, and the other one of the third surfaces 1221 is flush with the second surface 1212.

Figure 5:
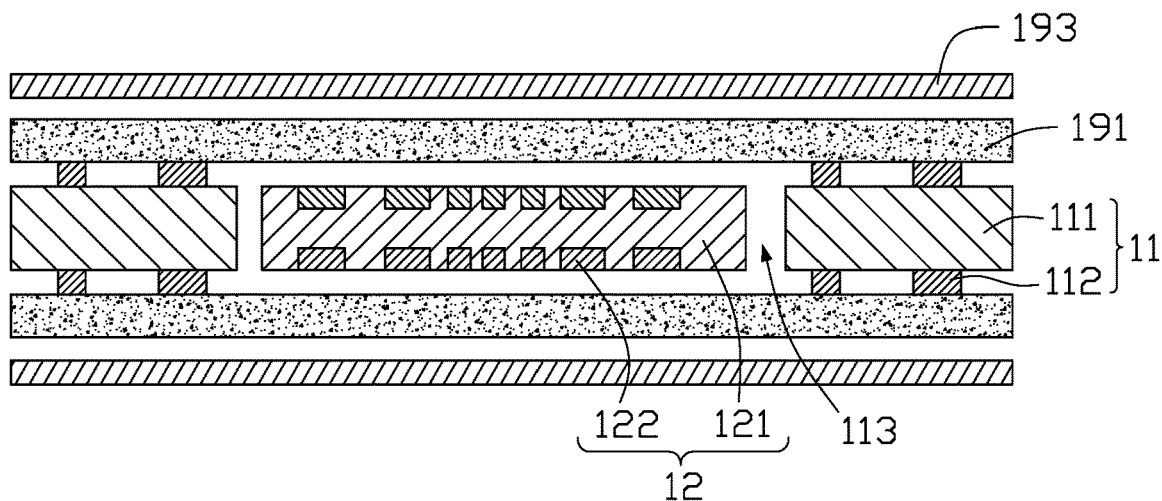
FIG. 5 is a cross-sectional view showing a first circuit structure, two dielectric material layers, and two second conductive material layers are provided, and the second circuit structure of FIG. 4 is placed in a receiving cavity defined in the first circuit structure.

At block 302, referring to FIG. 5, a first circuit structure 11 is provided. The first circuit structure 11 has at least one receiving cavity 113. And then, the second circuit structure 12 is put into the receiving cavity 113.

The first circuit structure 11 includes a first substrate layer 111 and two first circuit layers 112 formed on two opposite surfaces of the first substrate layer 111. The receiving cavity 113 penetrates the first substrate layer 111.

At block 303, referring to FIG. 5, two dielectric material layers 191 are provided and fixed on two opposite sides of the first circuit structure 11 and the second circuit structure 12, and two second conductive material layers 193 are provided and placed on two opposite sides of the two dielectric material layers 191.

Figure 6:
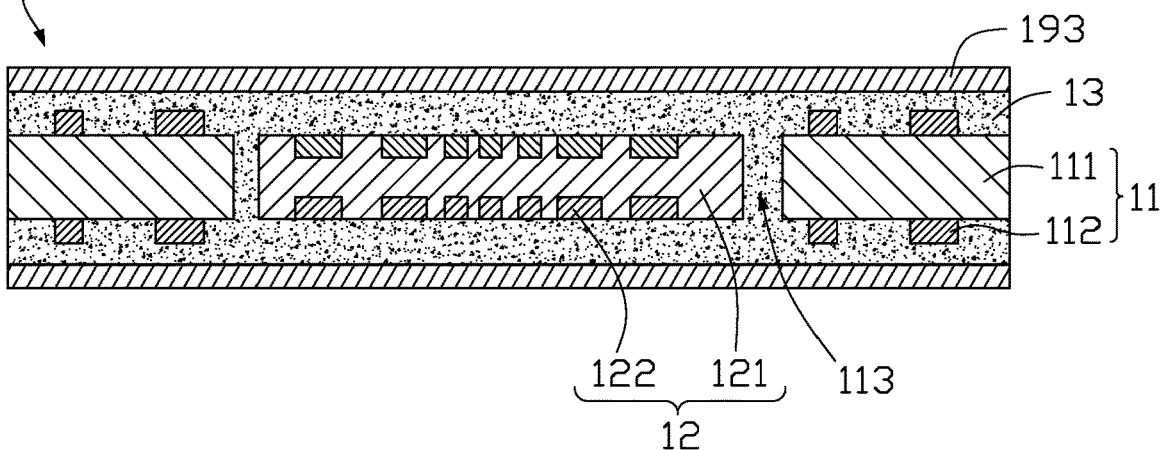
FIG. 6 is a cross-sectional view showing the two dielectric layers are pressed on the first circuit base board and the second circuit base board, and the two second conductive material layers are pressed on the two dielectric layers to form a second circuit substrate.

At block 304, referring to FIG. 6, the two second conductive material layers 193, the two dielectric material layers 191, and the first circuit structure 11 are pressed together to form a second circuit substrate 120. The second circuit structure 12 is imbedded in the receiving cavity 113 by the two dielectric material layers 191 and the first circuit structure 11.

In at least one embodiment, the two second conductive material layers 193, the two dielectric material layers 191, and the first circuit structure 11 are hot pressed together. The two dielectric material layers 191 are fused together to form a dielectric layer 13. A part of the dielectric layer 13 is filled into gaps between an inner wall of the receiving cavity 113 and the second circuit structure 12.

In at least one embodiment, the two second conductive material layers 193 can be a seed layer. The seed layer can be made of a metal element, an alloy, a metal oxide or the like. The third conductive material layer 193 may be formed by vapor deposition, evaporation, sputtering, coating or adhesion.

Figure 7:
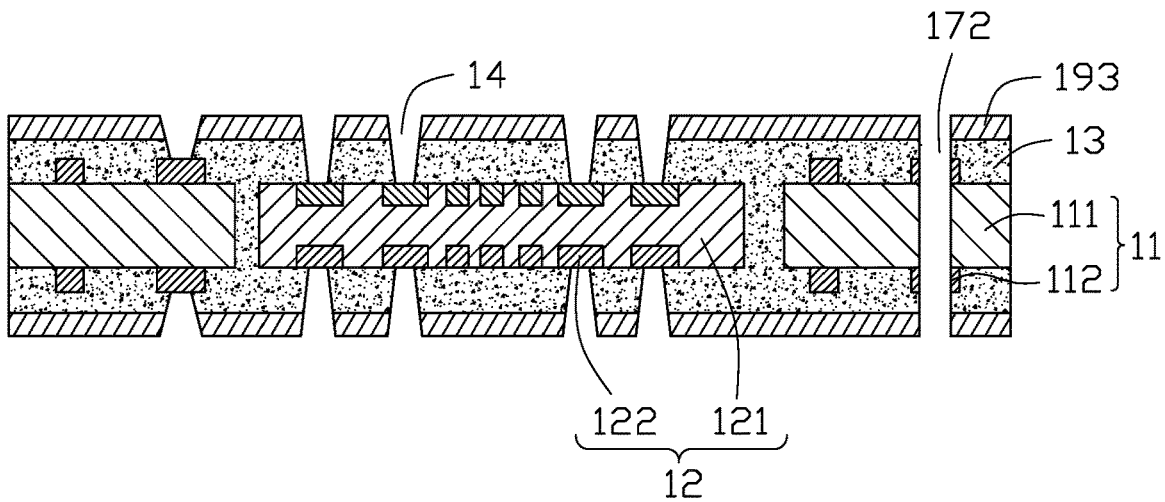
FIG. 7 is a cross-sectional view showing blind holes and at least one through hole are defined in the second circuit substrate.

At block 305, referring to FIG. 7, a plurality of blind holes 14 and at least one through hole 172 are defined in the second circuit substrate 120.

The plurality of blind holes 14 penetrate one of the two second conductive material layers 193 and a part of the dielectric layer 13. A part of the two second circuit layers 122 and a part of the two first circuit layers 112 are exposed from the blind holes 14.

The through hole 172 penetrates the two second conductive material layers 193, the first substrate layer 111, and the dielectric layer 13.

In at least one embodiment, the plurality of blind holes 14 and the through hole 172 are made by laser processing. In other embodiment, the plurality of blind holes 14 and the through hole 172 may be made by a high-pressure waterjet cutting, an air knife cutting, a lathe cutting, a chemical etching, a physical etching, or other forms.

Figure 8:
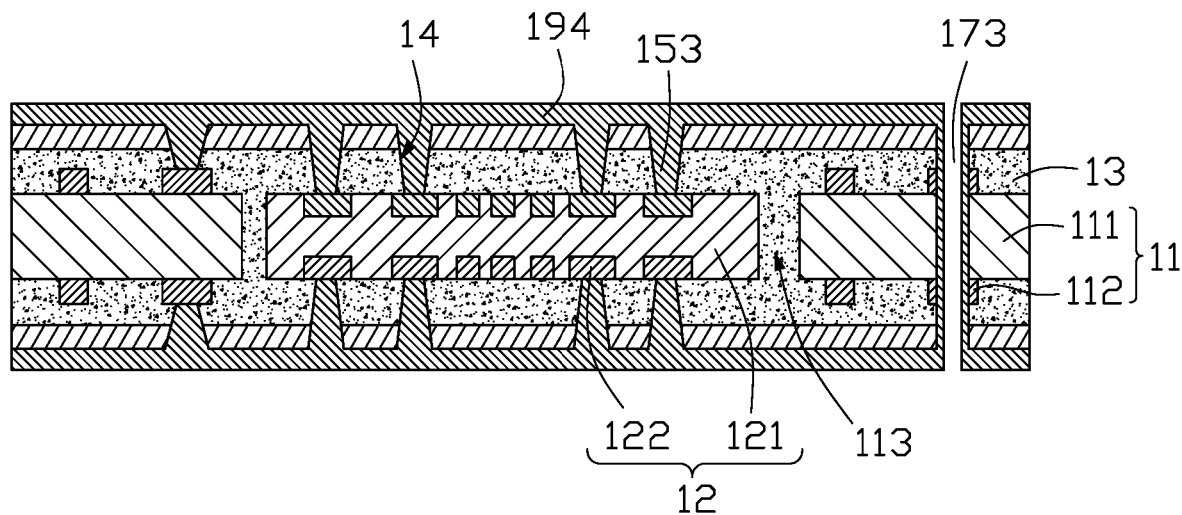
FIG. 8 is a cross-sectional view showing two third conductive material layers are formed on the second conductive material layer, filled in the blind holes, and formed on the inner wall of the through hole to make the blind holes become conductive blind holes, and make the through hole become a conductive hole.

At block 306, referring to FIG. 8, each of two third conductive material layers 194 is formed on each of the two second conductive material layers 193. Each of the third conductive material layer 194 covers each of the two second conductive material layers 193, is filled in the plurality of blind holes 14, and is formed on an inner wall of the through hole 172 to make the plurality of blind holes 14 become conductive blind holes 153, and make the through hole 172 become a conductive hole 173.

The two third conductive material layers 194 may be made of a metal element, an alloy, a metal oxide or the like. The two third conductive material layers 194 may be formed by vapor deposition, evaporation, sputtering, coating, adhesion or other forms. In at least one embodiment, the two third conductive material layers 194 may be grown by taking the two second conductive material layers 193 as seed layers.

Figure 9:
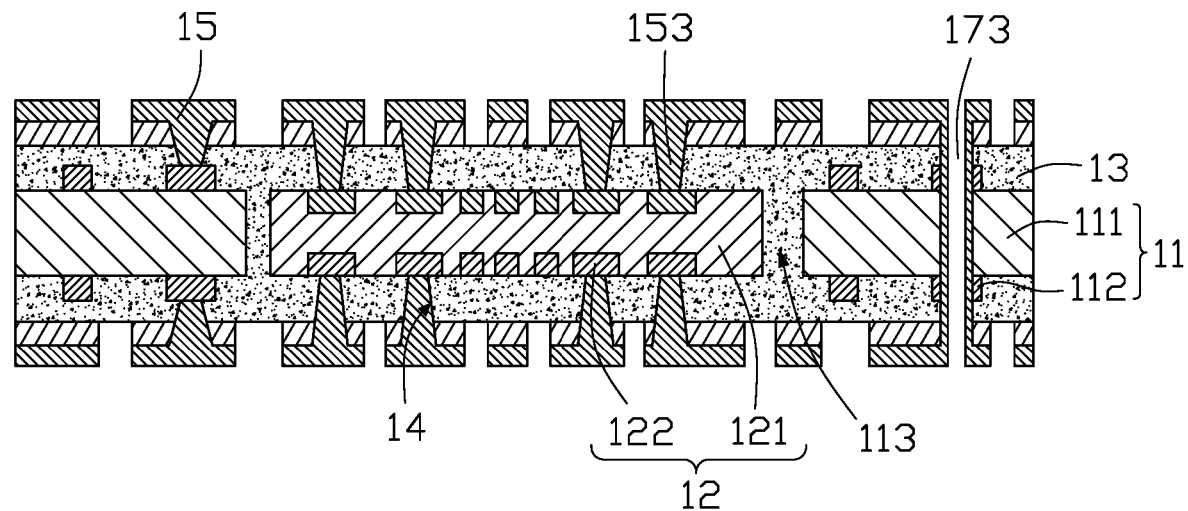
FIG. 9 is a cross-sectional view of two third conductive material layers and the two second conductive material layers are patterned to form two third circuit layers.
Figure 10:
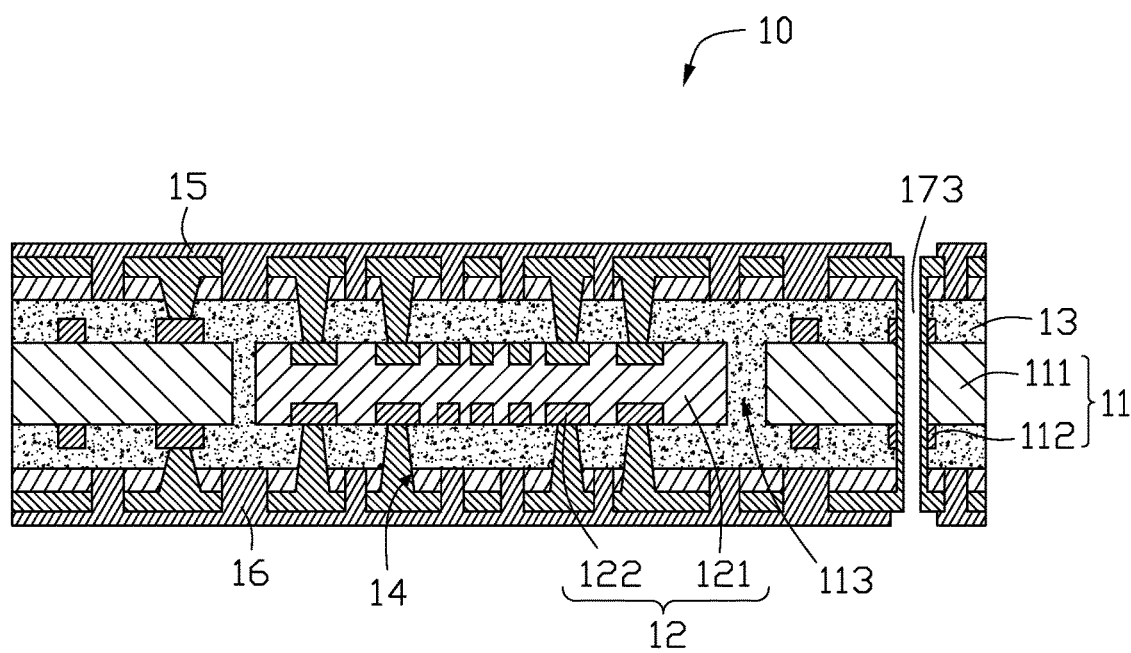
FIG. 10 is a cross-sectional view showing two protective layers are formed on the two third circuit layers of FIG. 9 to form a high-frequency circuit board.

At block 307, referring to FIG. 9, the two second conductive material layers 193 and the two third conductive material layers 194 are patterned to form two third circuit layers 15.

At block 308, referring to FIGS. 10-13, two protective layers 16 are formed on the two third circuit layers 15 respectively to get a high-frequency circuit board 10 (20).

The two protective layers 16 may be cover films or insulating inks. In at least one embodiment, the two protective layers 16 are insulating inks.

At block 309, the high-frequency circuit board 10 (20) are surface treated.

Figure 11:
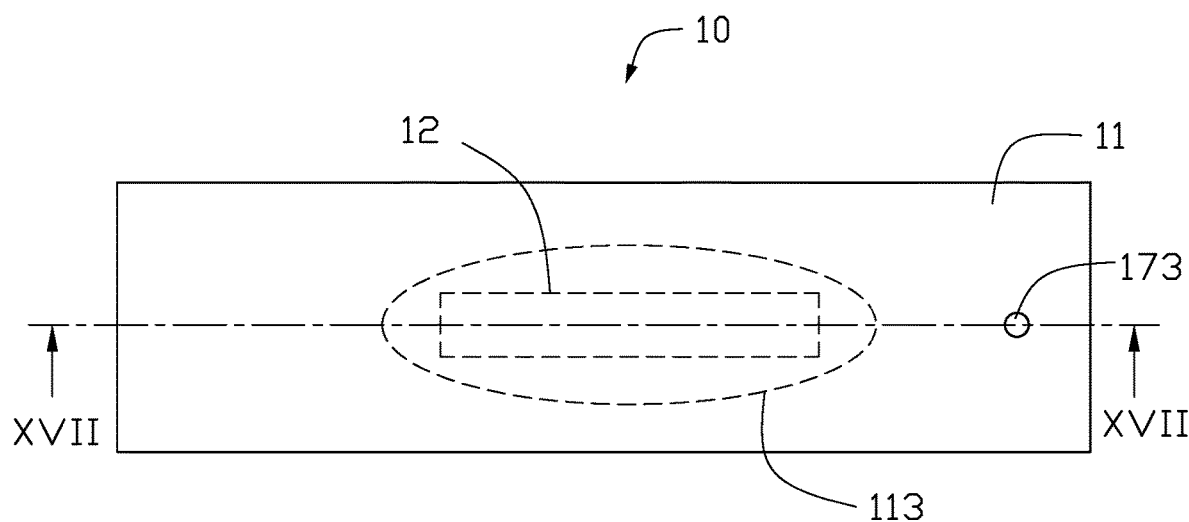
FIG. 11 is a top view of the high-frequency circuit board of FIG. 10.
Figure 12:
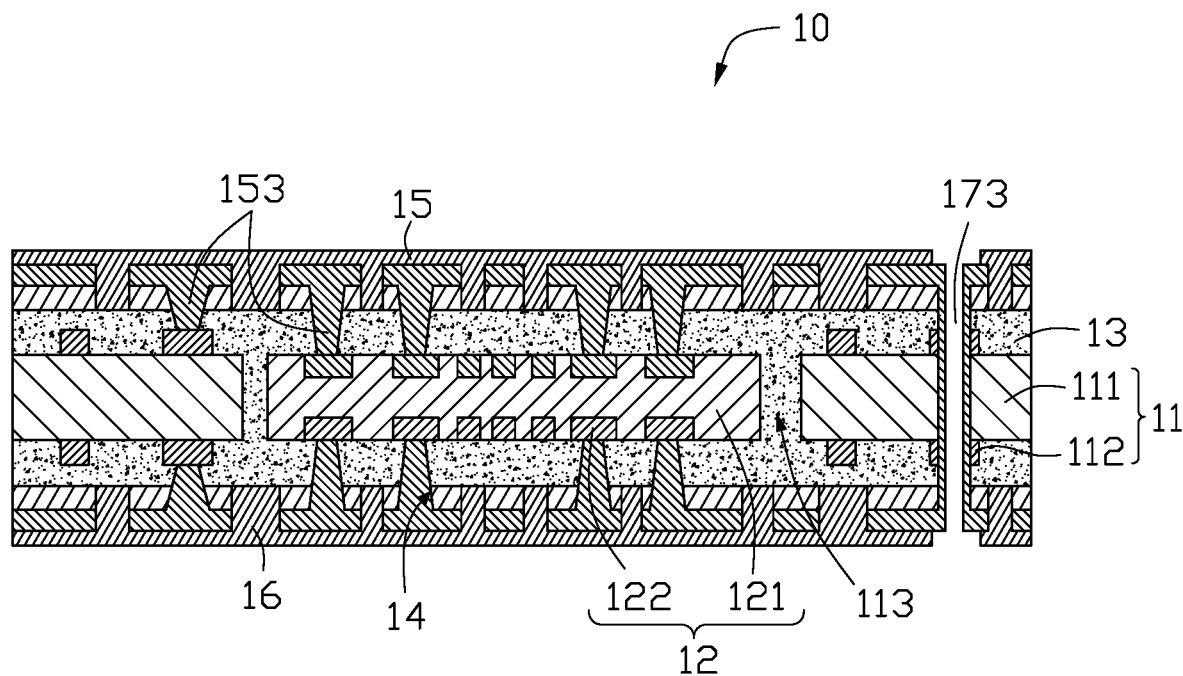
FIG. 12 is a cross-sectional view along line XVII-XVII of FIG. 11.
Figure 13:
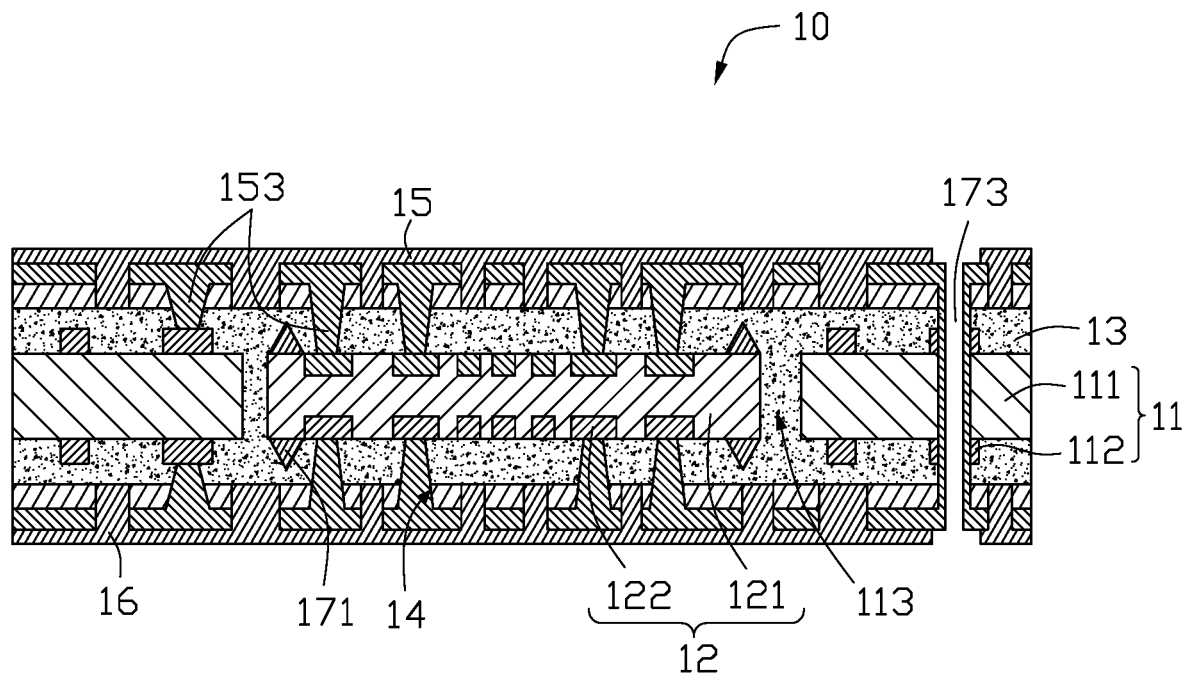
FIG. 13 is a cross-sectional view of another high-frequency circuit board.

Referring to FIGS. 11-13, the high-frequency circuit board 10 includes a first circuit structure 11, a second circuit structure 12 or 22, and a dielectric layer 13. The second circuit structure 12 is embedded in the first circuit structure 11. The dielectric layer 13 is formed on the first circuit structure 11.

The first circuit structure 11 includes a first substrate layer 111 and two first circuit layers 112 formed on two opposite surfaces of the first substrate layer 111. The first circuit structure 11 has at least one receiving cavity 113 defined in the first substrate layer 111. The receiving cavity 113 penetrates the first substrate layer 111. The second circuit structure 12 or 22 is received in the receiving cavity 113. The dielectric layer 13 is formed on the two first circuit layers 112. A part of the dielectric layer 13 is filled into gaps between an inner wall of the receiving cavity 113 and the second circuit structure 12 or 22 to avoid the first circuit structure 11 electrically connecting to the second circuit structure 12 or 22, and weaken electromagnetic interference between the first circuit structure 11 and the second circuit structure 12 or 22. The dielectric layer 13 covers the second circuit structure 12 or 22.

In at least one embodiment, referring to FIG. 12, the second circuit structure 12 includes a second substrate layer 121 and two second circuit layers 122 imbedded in the second substrate layer 121. The second substrate layer 121 includes a first surface 1211 and a second surface 1212 opposite to the second surface 1212. Each of the two second circuit layer 122 includes a third surface 1221. One of the third surfaces 1221 is flush with the first surface 1211, and the other one of the third surfaces 1221 is flush with the second surface 1212.

In other embodiment, referring to FIG. 13, the second circuit structure 22 includes a second substrate layer 121, two second circuit layer 122 imbedded in the second substrate layer 121, and a plurality of support columns 171 formed on the second substrate layer 121. The second substrate layer 121 includes a first surface 1211 and a second surface 1212 opposite to the second surface 1212. Each of the two second circuit layers 122 includes a third surface 1221. One of the third surfaces 1221 is flush with the first surface 1211, and the other one of the third surfaces 1221 is flush with the second surface 1212. The support columns 171 are embedded in the dielectric layer 13 to strengthen the connection of the second circuit structure 12 to the dielectric layer 13, further preventing the second circuit structure 12 from shifting. The support columns 171 may have a shape of a tapered, a column, a spherical, or the like that can strengthen the connection of the second circuit structure 22 and the dielectric layer 13.

Each of the two second circuit layers 122 has a circuit density that is greater than that of each of the two first circuit layers 112. The second circuit layer 122 and the two first circuit layer 112 are set at different horizontal planes to satisfy the requirement of high-density line layout.

The first circuit layer 112 and the second circuit layer 122 are used to transfer electrical signals. In at least one embodiment, the first circuit layer 112 and the second circuit layer 122 are made from copper. In other embodiments, the first circuit layer 112 and the second circuit layer 122 may also be made of other conductive materials, such as a metal element or an alloy, a metal oxides, etc.

In at least one embodiment, the two first circuit layers 112 have a same or different structure and circuit arrangement, and the two second circuit layers 122 have a same or different structure and circuit arrangement.

The high-frequency circuit board 10 further includes two third circuit layers 15 formed on the dielectric layer 13 and two protective layers 16 formed on the two third circuit layers 15.

The two third circuit layers 15 are used to transfer electrical signals. In at least one embodiment, the two third circuit layers 15 are made from copper. In other embodiments, the two third circuit layers 15 may also be made of other conductive materials, such as a metal element or an alloy, a metal oxides, etc.

In at least one embodiment, the two third circuit layers 15 have a same or different structure and circuit arrangement.

The high-frequency circuit board 10 further includes conductive blind holes 153 and at least one conductive hole 173. The third circuit layers 15 are electrically connected to the two second circuit layers 122 by the conductive blind holes 153. The two third circuit layers 15 are electrically connected to the two first circuit layers 112 by the conductive hole 173.

Figure 14:
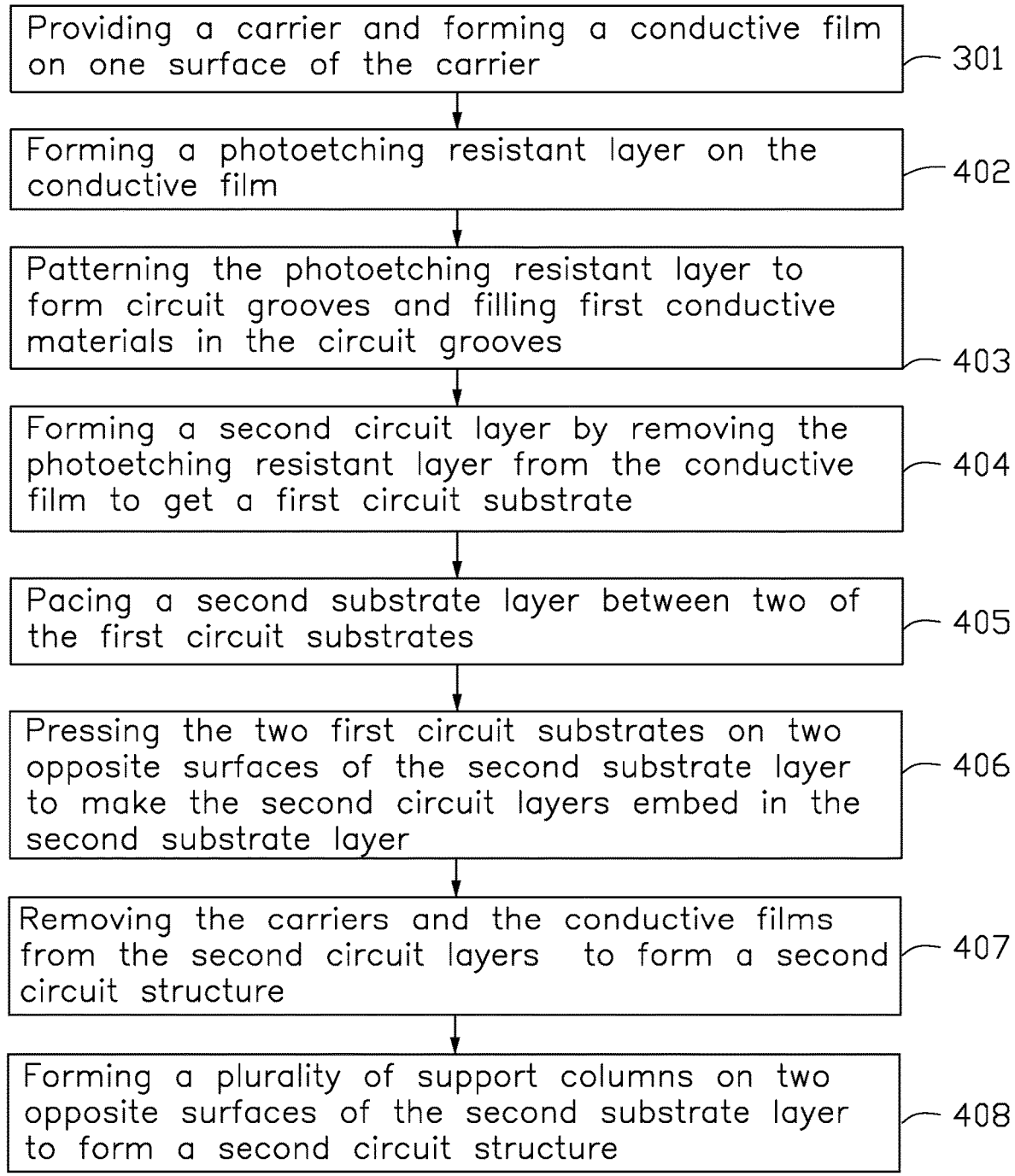
FIG. 14 is a flowchart of a method for manufacturing a second circuit structure in accordance with an embodiment.

FIG. 14 illustrates a flow chart of a method for manufacturing a second circuit structure 12 or 22 in accordance with an embodiment of the present disclosure. The example method is provided by way of example, as there are a variety of ways to carry out the method. The method described below can be carried out using the configurations illustrated in FIGS. 15-20 and 2-4, for example, and various elements of these figures are referenced in explaining example method. Each block shown in FIG. 14 represents one or more processes, methods, or subroutines, carried out in the example method. Additionally, the illustrated order of blocks is by example only and the order of the blocks can change. The example method can begin at block 401.

Figure 15:
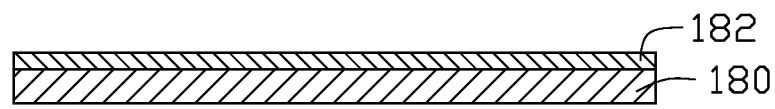
FIG. 15 is a cross-sectional view showing a carrier with a conductive film of FIG. 14.

At block 401, referring to FIG. 15, a carrier 180 is provided and a conductive film 182 is formed on one surface of the carrier 180.

Material of the carrier 180 may be at least one of polyimide (PI), liquid crystal polymer (LCP), polyethylene naphthalate (PEN), polyethylene glycol terephthalate (PET) or polyetheretherketone (PEEK).

The conductive film 182 may be a seed layer. The conductive film 182 is made from a conductive material. The conductive material may be a metal element, an alloy, a metal oxide, a seed layer, or the like.

The conductive film 182 may be disposed on the carrier 180 by vapor deposited, evaporation, sputtering, coating, or adhesion.

Figure 16:
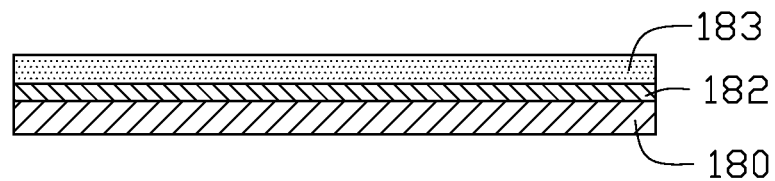
FIG. 16 is a cross-sectional view showing a photoetching resistant layer on the conductive film of FIG. 15.

At block 402, referring to FIG. 16, a photoetching resistant layer 183 is formed on the conductive film 182.

Figure 17:
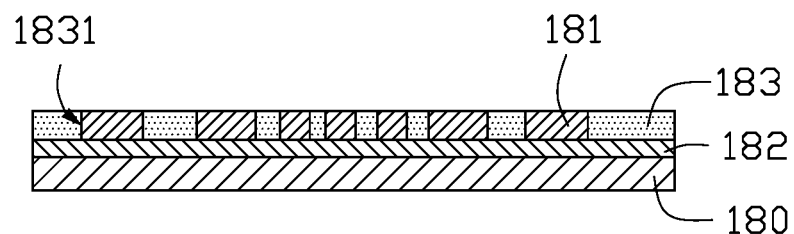
FIG. 17 is a cross-sectional view showing the photoetching resistant layer of FIG. 14 is patterned to form circuit grooves and first conductive materials are filled in the circuit grooves.

At block 403, referring to FIG. 17, the photoetching resistant layer 183 is patterned to form circuit grooves 1831 and first conductive materials 181 are filled in the circuit grooves 1831.

The first conductive materials 181 may be filled in the circuit grooves 1831 by physical vapor deposition (PVD), chemical vapor deposition (CVD) or sputter coating.

Figure 18:
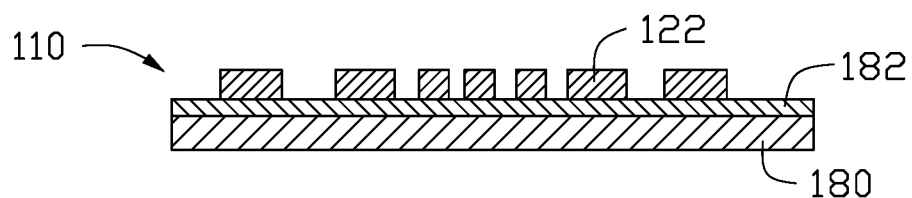
FIG. 18 is a cross-sectional view of a second circuit layer formed by removing the photoetching resistant layer of FIG. 17 from the conductive film of FIG. 17, and then a first circuit substrate is received.

At block 404, referring to FIG. 18, a second circuit layer 122 formed by removing the photoetching resistant layer 183 from the conductive film 182 to get a first circuit substrate 110.

The photoetching resistant layer 183 may be removed from the conductive film 182 by exposure development or laser lift-off.

Figure 19:
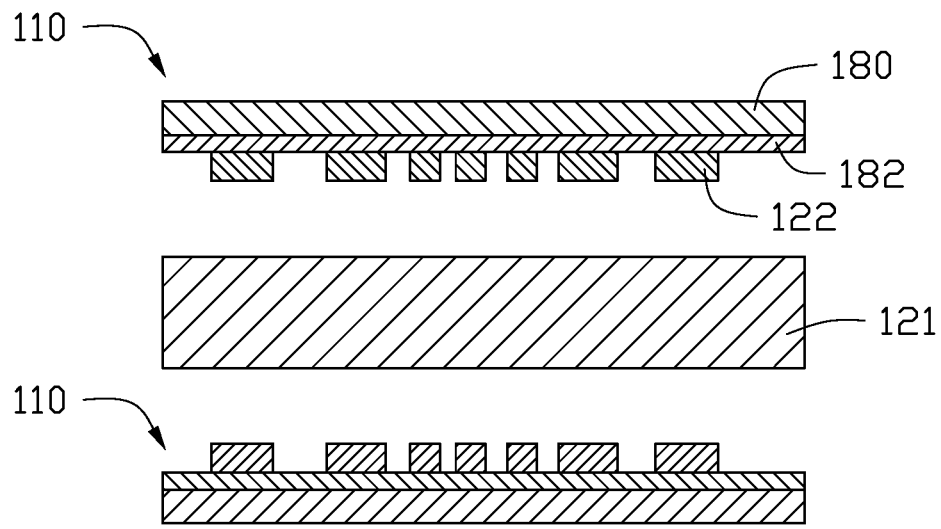
FIG. 19 is a cross-sectional view showing a second substrate layer is placed between the two first circuit substrates of FIG. 18.

At block 405, referring to FIG. 19, a second substrate layer 121 is placed between two of the first circuit substrates 110. The second circuit layers 122 faces the second substrate layer 121.

The second substrate layer 121 is made from a high-frequency material. The two first circuit substrates 110 have a same structure.

Figure 20:
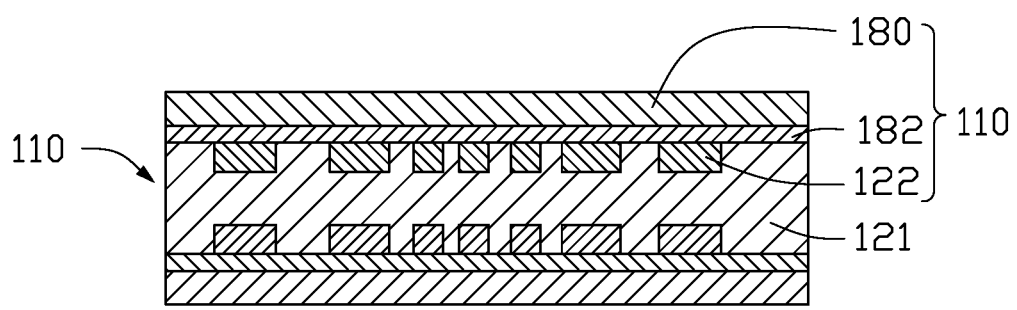
FIG. 20 is a cross-sectional view showing the two first circuit substrates of FIG. 19 are pressed on the second substrate layer of FIG. 19.

At block 406, referring to FIG. 20, the two first circuit substrates 110 are pressed on two opposite surfaces of the second substrate layer 121 to make the second circuit layers 122 embed in the second substrate layer 121.

At block 407, referring to FIG. 2, the carriers 180 and the conductive films 182 are removed from the second circuit layers 122 to form a second circuit structure 12.

At block 408, referring to FIG. 3, a plurality of support columns 171 is formed on two opposite surfaces of the second substrate layer 121 to form a second circuit structure 22.

A plurality of the second circuit structures 12 or 22 can be made on a base board 184 at a same time, and the plurality of the second circuit structures 12 or 22 are cut to obtain the second circuit structure 12 or 22.

With the above configuration, the first circuit structure 11 of the high-frequency circuit board 10 or 20 is made by a conventional etching process, and the second circuit structure 12 or 22 is made by an additive method, the two second circuit layers 122 are embedded in the second circuit structure 12 or 22, and make the dielectric layer 13 cover the second circuit structure 12 or 22 to weaken electromagnetic interference between the first circuit structure 11 and the second circuit structure 12 or 22. The first circuit layer 112 and the second circuit layer 122 are at different horizontal planes to satisfy the requirement of high-density line layout.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A high-frequency circuit board, comprising:
   a first circuit structure, wherein the first circuit structure comprises a first substrate layer and at least one first circuit layer; the at least one first circuit layer is formed on at least one surface of the first substrate layer; and at least one receiving cavity is defined in the first substrate layer;
   a second circuit structure embedded in the receiving cavity, wherein the second circuit structure comprises a second substrate layer, at least one second circuit layer embedded in the second substrate layer, and a plurality of support columns formed on the second substrate layer; and
   a dielectric layer formed on the second circuit layer, wherein a portion of the dielectric layer is filled into gaps between an inner wall of the receiving cavity and the second circuit structure; the plurality of support columns is embedded in the dielectric layer.

2. The high-frequency circuit board of claim 1, wherein the second circuit layer has a circuit density greater than a circuit density of the first circuit layer.

3. The high-frequency circuit board of claim 1, wherein the first circuit layer and the second circuit layer are at different horizontal planes.

4. The high-frequency circuit board of claim 1, wherein the high-frequency circuit board further comprises a third circuit layer formed on the dielectric layer and a protective layer formed on the third circuit layer.

5. The high-frequency circuit board of claim 4, wherein the high-frequency circuit board further comprises plurality of conductive blind holes and at least one conductive hole, the third circuit layer is electrically connected to the second circuit layer by the plurality of conductive blind holes, and the third circuit layer is electrically connected to the first circuit layer by the conductive hole.

6. The high-frequency circuit board of claim 1, wherein the second substrate layer is made from a high frequency material.

7. A method for manufacturing a high-frequency circuit board, comprising: providing a second circuit structure, wherein the second circuit structure comprises a second substrate layer, at least one second circuit layer embedded in the second substrate layer, and a plurality of support columns formed on the second substrate layer; providing a first circuit structure, wherein the first circuit structure comprises a first substrate layer and at least one first circuit layer; the at least one first circuit layer is formed on at least one surface of the first substrate layer; and at least one receiving cavity is defined in the first substrate layer; embedding the second circuit structure in the at least one receiving cavity; and pressing two dielectric material layers on the first circuit structure; wherein the two dielectric material layers are fused together to form a dielectric layer, and a portion of the dielectric layer is filled into gaps between an inner wall of the receiving cavity and the second circuit structure.

8. The method of claim 7, wherein further comprises:
   manufacturing the second circuit structure, comprises:
      providing a carrier and forming a conductive film on one surface of the carrier;
      forming a photoetching resistant layer on the conductive film;
      patterning the photoetching resistant layer to form circuit grooves and filling first conductive materials in the circuit grooves;
      forming a second circuit layer by removing the photoetching resistant layer from the conductive film to obtain a first circuit substrate;
      pressing two first circuit substrates on a second substrate layer, the second circuit layers are embedded in the second substrate layer; and
      removing the carriers and the conductive films.

9. The method of claim 7, wherein before two dielectric material layers are pressed on the first circuit structure, further comprises:
   providing two dielectric material layers and fixing the two dielectric material layers on the first circuit structure;
   providing two second conductive material layers and placing the two second conductive material layers on two opposite sides of the two dielectric material layers; and
   pressing the two second conductive material layers on the two dielectric material layers, respectively.

10. The method of claim 9, wherein further comprises:
    defining a plurality of blind holes and at least one through hole in the second circuit substrate; the blind holes penetrate one of the two second conductive material layers and a portion of the dielectric layer, a portion of the two second circuit layers and a portion of the two second circuit layers are exposed from the blind holes; and
    forming third conductive material layers on the two second conductive material layers to make the plurality of blind holes become conductive blind holes, and make the through hole become a conductive hole.

11. The method of claim 10, wherein further comprises:
    patterning the second conductive material layers and the third conductive material layers to form the third circuit layers; and
    forming two protective layers on the two third circuit layers, respectively.

12. The method of claim 10, wherein further comprises:
    surface treating the high-frequency circuit board.

13. The method of claim 7, wherein the first circuit layer and the second circuit layer are set at different horizontal planes.

14. The method of claim 7, wherein the second circuit layer has a circuit density greater than a circuit density of the first circuit layer.

15. The method of claim 7, wherein the second substrate layer is made from a high frequency material.

* * * * *